United States Patent [19]

Walia et al.

[11] Patent Number: 5,781,045
[45] Date of Patent: Jul. 14, 1998

[54] METHOD AND APPARATUS FOR PREDRIVING A DRIVER CIRCUIT FOR A RELATIVELY HIGH CURRENT LOAD

[75] Inventors: Rajan Walia, Singapore, Singapore; Billy E. Thayer, Corvallis, Oreg.

[73] Assignee: Hewlett-Packard Company, Palo Alto, Calif.

[21] Appl. No.: 706,377

[22] Filed: Aug. 30, 1996

Related U.S. Application Data

[63] Continuation of Ser. No. 412,421, Mar. 29, 1995, abandoned.

[51] Int. Cl.$^6$ .................................................. H03K 3/00
[52] U.S. Cl. .................. 327/108; 327/170; 327/380; 327/437; 326/87
[58] Field of Search .................................... 327/108, 112, 327/214, 170, 374–377, 427, 434, 436, 437, 404, 379–381, 389, 391; 326/82, 87

[56] References Cited

U.S. PATENT DOCUMENTS

| | | | |
|---|---|---|---|
| 4,638,187 | 1/1987 | Boler et al. | 326/27 |
| 4,719,369 | 1/1988 | Asano et al. | 326/30 |
| 4,731,553 | 3/1988 | Van Lehn et al. | 326/27 |
| 4,739,198 | 4/1988 | Maruyama | 327/52 |
| 4,820,942 | 4/1989 | Chan | 327/310 |
| 4,825,099 | 4/1989 | Barton | 307/270 |
| 4,825,101 | 4/1989 | Walters, Jr. | 326/87 |
| 4,961,010 | 10/1990 | Davis | 326/27 |
| 5,039,874 | 8/1991 | Anderson | 307/270 |
| 5,061,861 | 10/1991 | Sameshima et al. | 327/109 |
| 5,192,881 | 3/1993 | Martin | 326/87 |
| 5,218,239 | 6/1993 | Boomer | 326/27 |
| 5,281,870 | 1/1994 | Kobatake | 327/170 |
| 5,293,082 | 3/1994 | Bathaee | 327/170 |
| 5,315,173 | 5/1994 | Lee et al. | 326/21 |

FOREIGN PATENT DOCUMENTS 0315473 11/1988 European Pat. Off. .

*Primary Examiner*—Kenneth B. Wells

[57] ABSTRACT

A predriver circuit for current switching, di/dt, noise control for high current load devices is disclosed. Parallel weak pull up and pull down circuit paths are combined with strong pull up and pull down circuit paths, respectively, to provide control over the rate of change of current through the load during predetermined turn-on and turn-off time periods. Predriver control for both NMOS driver, current sink NMOS, and PMOS driver, current source PMOS, are demonstrated. The predriver circuit provides control of the rate of current switching through the load without excessive delay in fully turning on or off the load device.

8 Claims, 3 Drawing Sheets

METHOD AND APPARATUS FOR PREDRIVING A DRIVER CIRCUIT FOR A RELATIVELY HIGH CURRENT LOAD

CROSS REFERENCE TO RELATED APPLICATION

This is a continuation of application Ser. No. 08/412,421 filed on Mar. 29, 1995, now abandoned.

FIELD OF THE INVENTION

The present invention generally relates to driver circuits for loads which draw a large current (such as light emitting diode drivers) and the reduction of electromagnetic inductance noise emissions caused by high current switching through wires to current loads.

BACKGROUND OF THE INVENTION

In heavy current driver circuits, such as light emitting diode ("LED") drivers and input-output circuits, there is a relatively large current flow through the power pins. This current is switched on and off by a control signal. Rapidly cycling or changing the state of an LED results in the generation of undesirable electromagnetic inductive ("EMI") noise expressed as L*di/dt, where L is circuit bonding wire inductance. A matrix of LED's, as may be found on control panels in a variety of commercial products, magnifies the problem.

In addition to affecting the operation of other components of a commercial electronic product, EMI emissions are considered a hazard and are thus controlled under various standards and government regulations. Therefore, there is a need for devices to control emissions.

In order to reduce di/dt noise from driving higher current loads, one can control the rate at which the current is being supplied to the load. In general, it is common to slow down the rate at which a driver cycles a heavy current load by providing a predriver circuit sized (that is, chosen to have predetermined operating characteristics) to slow down the rate at which the predriver affects the drive current. However, if the turn on or off rate is high enough to achieve a desired speed of operation, the di/dt noise is also still relatively high. On the other hand, if the predriver turn on or off rate is kept low to reduce noise emissions, it may take too long to drive the load to its new state.

A method and apparatus for increasing signal transition speed is shown by Anderson in U.S. Pat. No. 5,039,874. For driving an integrated circuit output pad, Anderson switches between two output drivers dependent upon pad noise levels where one driver may be disconnected if the particular application is affected by the increased noise level.

However, there is a need for a general application method and device to control the rate at which the current source and sink driver for a heavy current load is cycled in order to achieve lower di/dt and effect a lower EMI noise output. It is necessary to provide a method and device which will achieve a lower di/dt rate in a high current load without introducing excessive delays in fully switching the load state. The present invention is particularly suited to LED driver circuitry.

SUMMARY OF THE INVENTION

In its basic aspects, the present invention provides a current control circuit device for a high current load, having a driver circuit, in a circuit having a power supply and a signal generator for generating a signal to the load. The current control circuit device includes: an input connected to the signal generator; an output connected to the driver circuit; a pull up circuit connected between the device input and the output for controlling the rate of current change through the load, having a weak pull up device and a strong pull up device connected in parallel; and a pull down device connected between the device input and output for controlling the rate of current change through the load, having a weak pull down device and a strong pull down device connected in parallel.

It is an advantage of the present invention to provide a heavy current load predriver circuitry that controls the rate of current switching through a source or sink that suppresses the noise generated by L*di/dt.

It is another advantage of the present invention that it provides a method and device that controls the rate at which the current source and sink are turned on and off without excessive delay in fully changing the load state condition.

Other objects, features and advantages of the present invention will become apparent upon consideration of the following detailed description and the accompanying drawings, in which like reference designations represent like features throughout the FIGURES.

DESCRIPTION OF THE DRAWINGS

FIGS. 4A through 4D are waveform diagrams for the present invention as shown in FIG. 1 in which:

FIG. 4A is a voltage waveform at the output of the predriver circuit of the present invention as shown in FIG. 3.

FIG. 4B is a voltage waveform at the output of the predriver circuit of the present invention as shown in FIG. 2, and FIG. 4C is a current waveform through the load in conjunction with the present invention as related to FIGS. 4A and 4B.

FIG. 4D is a waveform of the time differential of the load current of FIG. 4C indicating switching speed.

The drawings should be understood as not being to scale except where specifically noted.

DETAILED DESCRIPTION OF THE INVENTION

Reference is made now in detail to a specific embodiment of the present invention, which illustrates the best mode presently contemplated by the inventors for practicing the invention. Alternative embodiments are also briefly described as applicable. In an exemplary embodiment, an application for an LED driver adaptation is described. However, it will be recognized by a person skilled in the art that the present invention is adaptable to a variety of high current load applications. No limitation is intended by the inventors nor should any be implied from the use of an exemplary embodiment used to facilitate the description of the invention.

Figure 1:
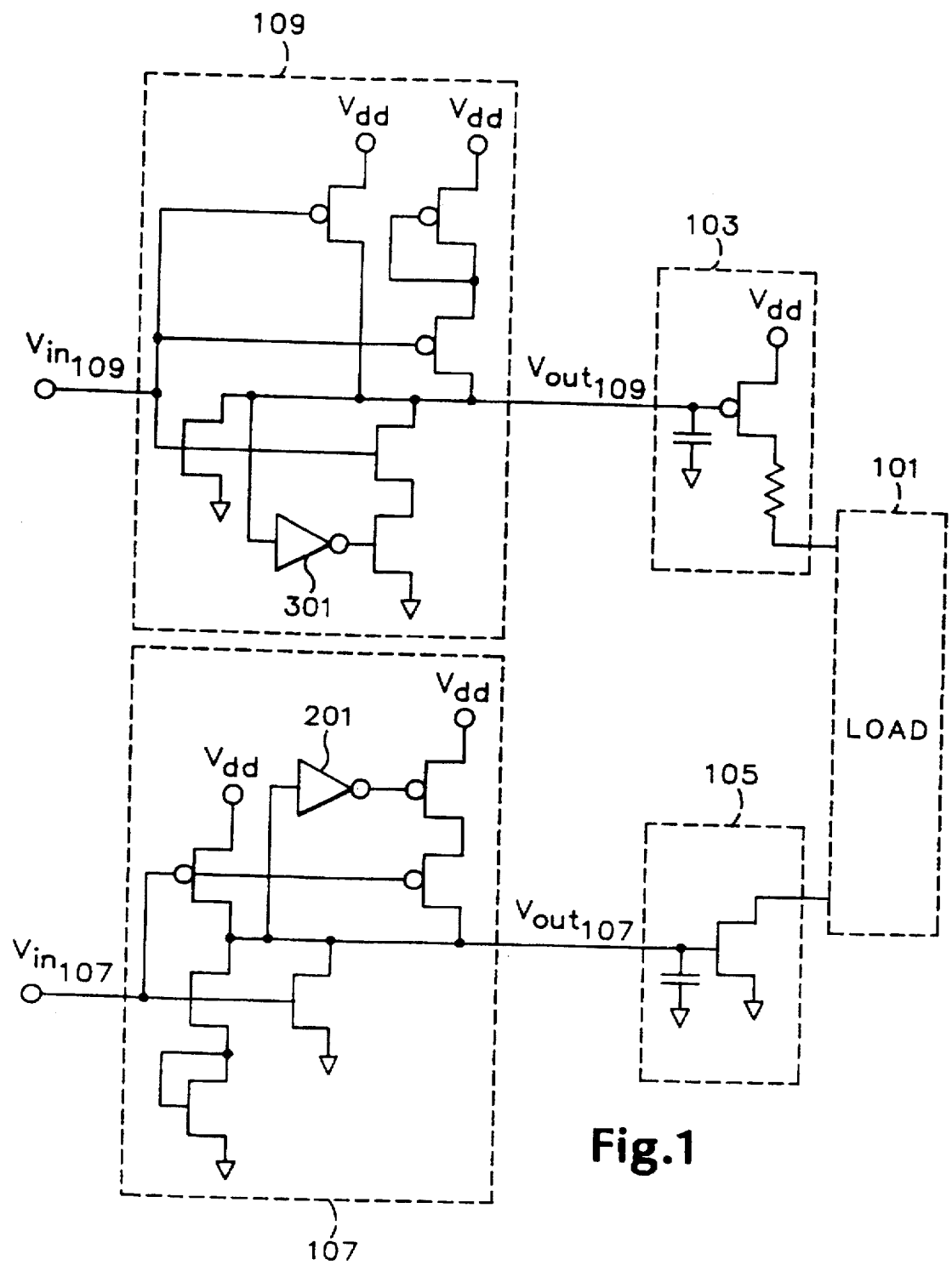
FIG. 1 is a circuit block diagram of the present invention in conjunction with an exemplary load.

The present invention as shown in FIG. 1 is adapted to a high current load 101 to control the rate of current switching through a source (PMOS) or sink (NMOS) in order to suppress the noise generated by a current change, di/dt, as the load is cycled, e.g., a matrix of LED indicators in a control panel apparatus in which LED's are selectively turned on and off. Each LED has a source driver 103 and a sink driver 105 as is known in the art. In general, the matrix is adapted to have a plurality of addressable column drivers 103 and field drivers 105 to control the selection of LED's to be switched in accordance with predetermined operational user indications, namely by a particular column and field driver set being switched by the control signal. A field predriver circuit 107 for the field driver(s) 105 and a column predriver circuit 109 are provided.

Figure 2:
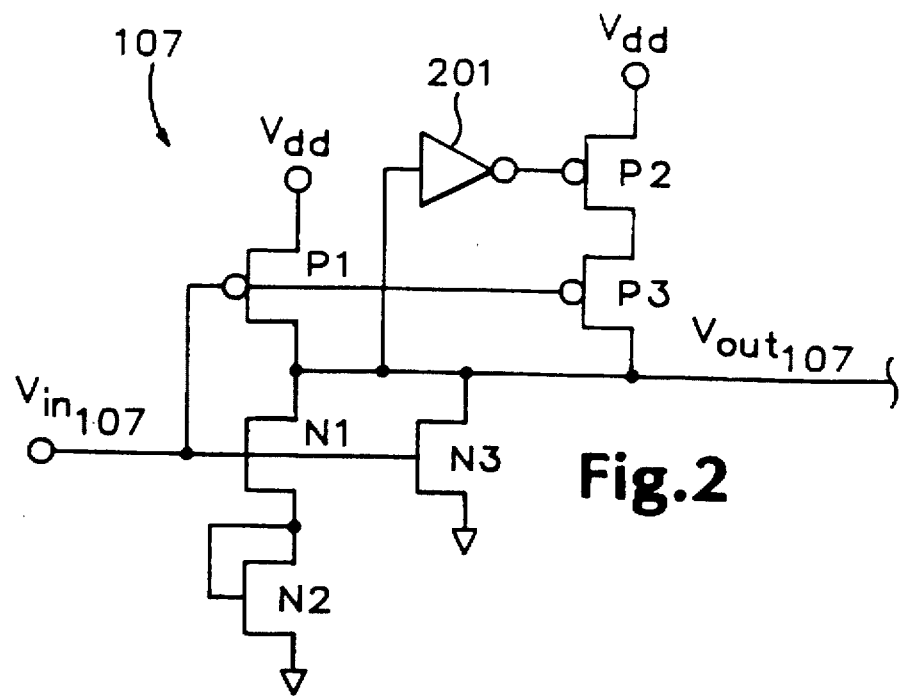
FIG. 2 is a circuit block diagram of a predriver circuit of the present invention for a NMOS load driver.

The field predriver circuit 107 of the present invention as shown in FIG. 1 is shown and detailed in FIG. 2. The implementation is for a pull down NMOS driver 105, or as a current sink. The control signal for the field select is shown as Vin107 and will generally be, for example, a HIGH (or digital 1) or a LOW (or a digital 0), depending on whether the field driver 105 associated therewith is to be ENABLED or DISABLED, respectively.

There are two parallel paths from Vout107 to circuit ground in the field predriver circuit 107. The components of these paths will be used to control the turn off rate of the LED load 101.

The first path is through the series combination of transistors N1 and N2. NMOS transistor N1 is connected between Vout107 with its gate to Vin107, with its drain to Vout, and its source to the drain of N2. NMOS transistor N2 is diode connected with its drain to the source of N1 and its source to ground. These transistors are sized to provide a strong pull down. The second of the two parallel paths from Vout107 to circuit ground is through transistor N3. NMOS transistor N3 is sized to provide a weak pull down.

Field predriver circuit 107 further includes a half latch connected between Vout107 and the circuit bias voltage supply, Vdd, and a PMOS transistor P1 connected between Vdd and Vout107. PMOS transistor P1 has its gate connected to Vin107, its source to Vdd and its drain to Vout107. The half latch is formed by inverter 201, having its input coupled to Vout107 and its output coupled to a PMOS transistor P2 at its gate. PMOS transistor P2 has its source connected to Vdd and its drain to a source terminal of another PMOS transistor P3. PMOS transistor P3 has its gate connected to Vin107 and its drain connected to Vout107.

Figure 3:
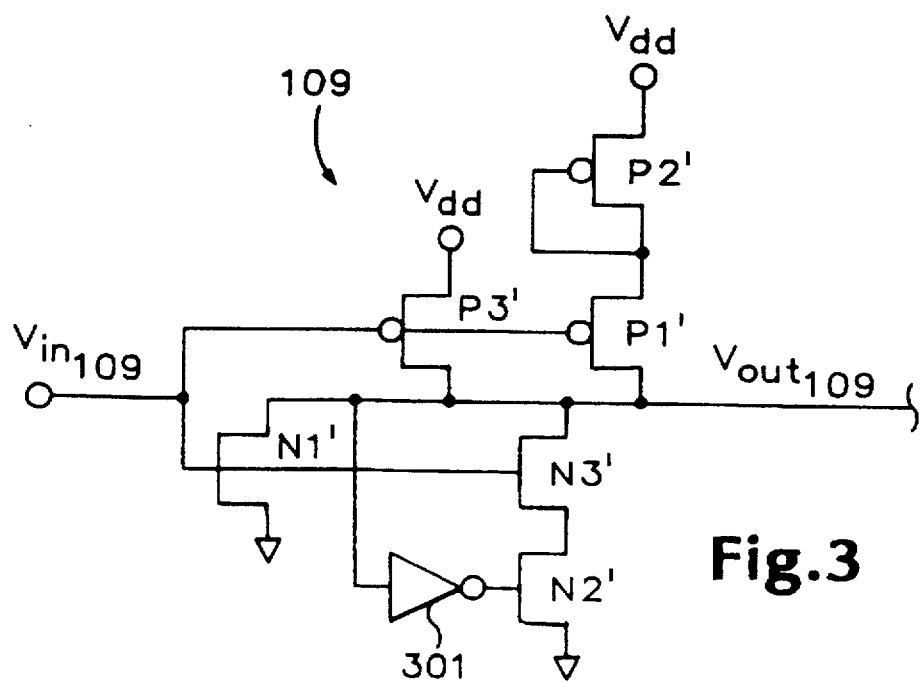
FIG. 3 is a circuit block diagram of a predriver circuit of the present invention for a PMOS load driver.

The column predriver circuit 109 is shown in FIG. 3. The circuit is equivalent to the field predriver circuit but configured for a PMOS current source, or pull up PMOS column driver 103. As is known in the art, therefore, it is biased and connected as a pull up circuit.

There are two parallel paths from Vout109 to Vdd. One path is through the series combination of P1' and P2'. P2' is diode connected and P1 is connected between Vout109 and the drain terminal of P2'. As in the field predriver circuit 107, a weak pull up transistor P3' is connected between Vout109 and Vdd, only in this configuration a PMOS type.

A half latch is connected between Vout109 and ground. This half latch is formed by inverter 301 and transistors N2' and N3'. Similarly, a weak pull down is provided in the form of NMOS transistor N1' connected between Vout109 and ground.

With the field predriver 107 connected to the load 101 via the field driver 105 (pull down NMOS current sink) and the column predriver 109 connected to the load 101 via the column driver 103 (pull up PMOS current source) as shown in FIG. 1, the rate of current through the load when switching between states is controlled. In other words, the rate at which the current source and sink are turned on and off is controlled to achieve a lower di/dt and, therefore, less EMI noise is generated during current switching.

Operation of the circuit is demonstrated in conjunction with the waveforms as shown in FIG. 4. The output voltage of the column predriver 109, Vout109, is plotted in FIG. 4A. The output voltage of the field predriver 107, Vout107, is plotted in FIG. 4B. The load 101 current is plotted in FIG. 4C. Note, however, that the di/dt shown in FIG. 4D is concentrated at time periods $t_2$ and $t_4$ of FIGS. 4A and 4B. As such, the goal of the present invention is met. NMOS (FIELD) PREDRIVER Vin107 is generally a HIGH or LOW indicating that a field select line for a matrix of LED's is enabled or disabled. As Vin107 goes HIGH the gate voltage on transistors N1 and N3 rises, transistors N1 and N3 turn on and transistor N3 starts conducting since it is sized as a weak pull down. Recall that transistors N1 and N2 are selected to provide a strong pull down to the load, $V_L$. As the voltage across transistor N2 approaches $V_m$, where "$V_m$" is the threshold voltage of NMOS transistor N2 (namely, the turn-on/turn-off point depending on the direction of the gate swing), the current through transistor N2 falls to a very low value. That is, this is the point where the design in accordance with the present invention is meant to traverse relatively slowly. The series combination of transistors N1 and N2 have a high resistance to ground and the parallel combination with transistor N3 thus determines the rate at which $Vout_{107}$ falls to ground. In other words, by preselecting appropriately sized transistors, the circuit can be tailored such that the driver 105 gate voltage will have two different rates of fall. Initially, the path through transistors N1 and N2 control and $Vout_{107}$ will fall rapidly (see FIG. 4B, $t_1$) and current switching is as shown in FIG. 4C As $Vout_{107}$ approaches $V_m$, transistor N3 controls and the rate of fall will become slower (FIG. 4B, $t_2$). Current is switched (FIG. 4C). Note that this initial fast rate of fall of $Vout_{107}$, and hence the gate voltage of the driver 105 gate voltage, reduces the time to turn off the driver 105 fully whereas the subsequent slower rate of fall helps keep di/dt noise under control (FIG. 4D) as the bulk of the current switching takes place in this region, where the gate voltage passes through $V_m$. In region $t_3$, the current reaches a steady state; the LED would be off.

Similarly, there are two regions in the turn on process; an initial slow rise of driver 105 gate voltage and a subsequent quick rise time to Vdd.

For the turn on process, the weak pull up transistor P1 causes $Vout_{107}$ to rise at a slow rate during an initial turn on period, $t_4$. As $Vout_{107}$ rises, the inverter 201 starts to turn on while the weak pull up transistor P1 is controlling. During period $t_5$, the strong pull up formed by transistor P2 and P3 causes $Vout_{107}$ to rise at a much faster rate, but not much current is switched. Transistors P2 and P3 are sized to get the desired time constant for the latter time period, whereas the threshold voltage of the inverter 201 determines the voltage at which the strong pull-up path starts turning on. Again note that the bulk of the load current is switched in the region where the gate voltage is varying slowly. This keeps the di/dt noise within the predetermined limits, yet the fast $Vout_{107}$ rise gets the driver 105 to a full turn on with a minimal delay.

It is when the gate-source voltage of the NMOS driver is close to $V_m$ that the bulk of the load current is switched. Hence, to keep di/dt low, this region, where the gate-source voltage is close to $V_m$, is traversed very slowly.

When the pull-down transistors are being turned on by $Vin_{107}$, the pull-up transistors are being turned off. The opposite is also true. This allows $Vout_{107}$ to swing from rail to rail as in a steady state only if one of them is fully on and the other is fully off.

PMOS (COLUMN) PREDRIVER

Figure 4C:
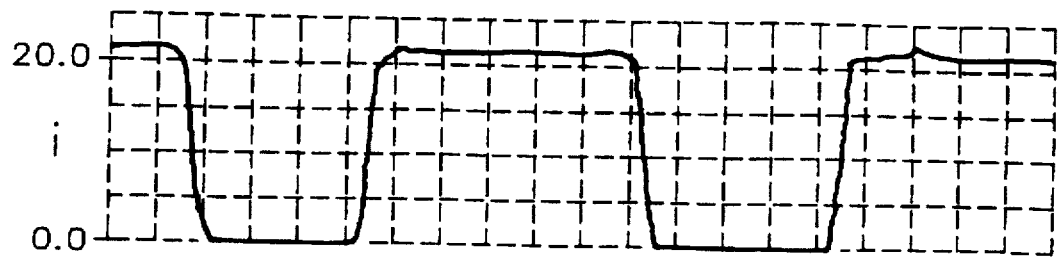
Figure 4D:
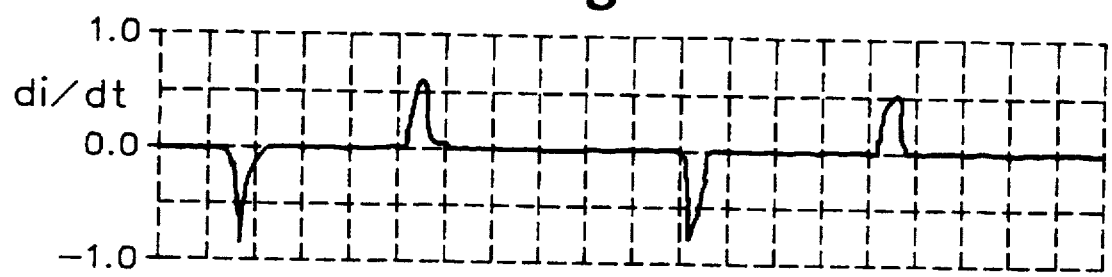
Figure 4A:
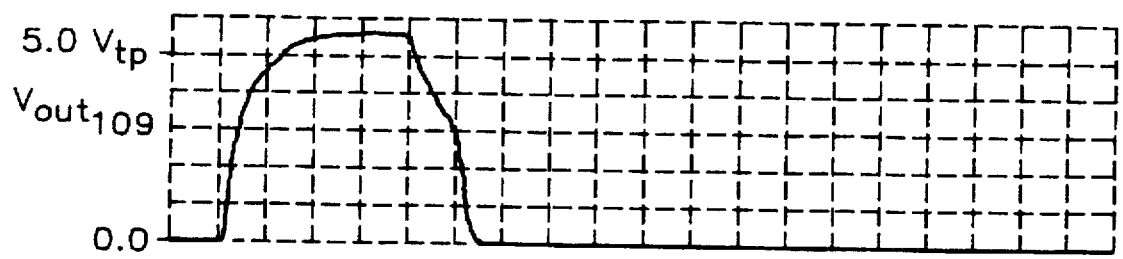
Figure 4B:
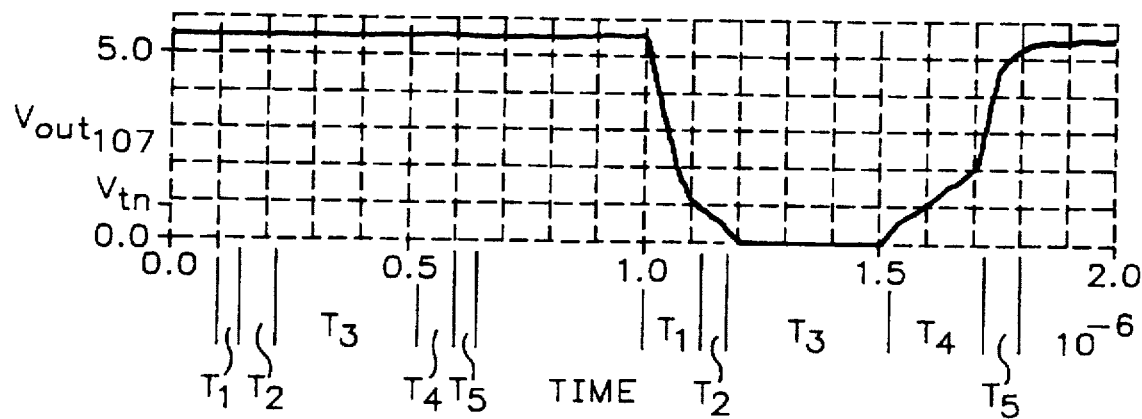

Operation of the column predriver circuit 109 for a PMOS driver 103, e.g., a current source for an LED or a column is shown in FIG. 4A.

As voltage $Vin_{109}$ falls, transistors P1' and P3' will turn on and transistor P2' starts conducting, providing a strong pull up toward Vdd. Transistor N1' and N3' will turn off, allowing $Vin_{109}$ to rise. The series combination of transistors P1' and P2' will have resistance to Vdd and the parallel combination with P3' will determine the rate at which $Vout_{109}$ rises to Vdd, the rate slowing as the driver 103 gate voltage reaches Vdd when current switching is most prominent and hence most di/dt noise is generated. In other words, by selecting appropriate design characteristics for transistors P1' and P2' to provide a strong pull up and transistor P3' to provide a weak pull up, the driver 103 gate voltage is tailored to have two different transition rates.

As shown in FIG. 4A, initially, during time $t_1$ the output voltage of the column predriver 109, $Vout_{109}$, and hence the gate voltage of the drive 103, rises relatively rapidly. As $Vout_{109}$ approaches Vdd and transistor P3' takes control, the rise time will lengthen (FIG. 4A, $t_2$) until Vdd–$|V_{tp}|$, where $V_{tp}$ is the threshold voltage of the PMOS transistor, is achieved. The initial fast rate of rise of the driver 103 gate voltage thus reduces the time to turn off its PMOS driver transistor fully, whereas the low time constant keeps di/dt noise under control as the bulk of the current switching takes place during this latter time period, $t_2$.

For the turn on process, transistor N1' acts as a weak pull down connection between ground and $Vout_{109}$. During turn on operation, the weak pull down transistor N1' causes $Vout_{109}$ to fall at an initial slow rate (FIG. 4A, $t_4$). As the output voltage falls, the inverter 301 starts turning on and the strong pull down formed by transistors N2 and N3 causes $Vout_{109}$ to fall faster than the initial rate (FIG. 4A, $t_5$). The predetermined threshold voltage of the inverter 301 determines the voltage at which the strong pull down pair starts turning on. Once again, note that the bulk of the current switching is in the region where the gate voltage of the drive 103 is varying slowly. This keeps di/dt noise under control, yet the fast $Vout_{109}$ initially keeps the PMOS driver full turn on time to a minimum.

In other words, there are two regions in the turn off process; first, when the gate voltage rises rapidly towards Vdd–$|V_{tp}|$; and, second, when $Vout_{109}$ gradually rises to Vdd.

Similarly, there are two regions in the turn on of the PMOS driver process; first, when $Vout_{109}$ falls slowly and subsequently when it falls rapidly to ground.

It is when the gate-source voltage of the PMOS driver is close to $V_{tp}$ that the bulk of the load current is switched. Hence, by varying the gate-source voltage of the PMOS driver very slowly in this region, di/dt is kept low.

Once again, note that when the pull-up transistors are being turned on, the pull-down transistors are being turned off. In steady state, only one of the two is fully on and the other is fully off. This allows $Vout_{109}$ to swing from rail to rail.

In summary, the use of the disclosed combination of weak elements and strong elements provides a scheme where the bulk of current switching occurs when the weak elements are active. This helps keep noise low. The strong elements help reduce transition time, but hardly participate in current switching whereas the weak elements participate strongly in the current switching but are slower. As shown in FIGS. 4A to 4D, at times $t_2$ and $t_4$, all the current transition is localized, all di/dt is localized, the gate voltages of the driver have low slopes, and the gate-source voltage is close to the threshold voltage. Thus, the present invention provides predriver devices for PMOS and NMOS type driver circuits that will reduce the di/dt noise due to high current load switching, yet which will permit driver turn on and turn off times to be kept to an acceptable minimum.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application to thereby enable others skilled in the art to understand the invention for various applications with various modifications as are suited to the particular use contemplated. It is intended that the scope of the invention be defined by the claims appended hereto and their equivalents.

What is claimed is:

1. A circuit for providing controlled shut down of an electronic device, the circuit comprising:

an input line;

a first transistor having a first current flow capacity, the input line being connected to the gate of the first transistor;

a second transistor having a greater second current flow capacity, the input line being connected to the gate of the second transistor;

an output line connected to the respective drains of the first and second transistors;

current limiting means connected between the source of the second transistor and a ground line, for conducting current between the second transistor and the ground line at a first rate when a voltage above a preselected threshold voltage is applied between the input line and the ground line, and for limiting current flow between the second transistor and the ground line to a second rate less than the first rate when a voltage less than the preselected threshold is applied, the input of the current limiting means connected to the source of the second transistor; and the ground line also being connected to the source of the first transistor.

2. The circuit of claim 1 wherein the current limiting means comprises a diode connected transistor having a drain connected to the source of the second transistor, and a source connected to the ground line.

3. The circuit of claim 1 wherein the current limiting means comprises a third transistor having a drain connected to the source of the second transistor, and a source connected to the ground line, and an inverter connected between the predriver output line and the gate of the third transistor.

4. The circuit of claim 1 including a power transistor having a gate connected to the predriver output and having a threshold voltage below which current does not flow through the power transistor.

5. The circuit of claim 4 wherein the current limiting means comprises a diode connected transistor having a drain connected to the source of the second transistor, and a source connected to the voltage plane, and wherein the diode connected transistor has a threshold voltage greater than the threshold voltage of the power transistor, such that upon switching the input line when the output voltage is high, the diode connected transistor blocks further current flow through the second transistor prior to shutoff of the power transistor, and wherein the power transistor shuts off while the output voltage is dropping at a limited rate limited by the first transistor.

6. A method of operating a predriver circuit having an input and having an output connected to an output device, the method comprising:

providing a first input voltage to the input;

while providing the first voltage to the input, maintaining the output at a first output voltage;

switching the voltage at the input to a different second input voltage;

in response to switching to the second input voltage, transitioning the output voltage from the first output voltage to a different second output voltage;

transitioning the output voltage in at least two phases;

a first transitioning phase comprising changing from the first output voltage at a first rate to an intermediate output voltage having a value intermediate the first and second output voltages;

a second transitioning phase comprising changing from the intermediate output voltage at a slower second rate to the second output voltage;

transitioning the output voltage during the first transitioning phase including providing current flow between the output and an electrical element maintained at the second output voltage via a first path and a second path; and transitioning the output voltage during the second transitioning phase including providing current flow between the output and an electrical element maintained at the second output voltage only via the second path.

7. The method of claim 6 wherein the first path includes a diode connected transistor selected to prevent the flow of current when the voltage across the diode connected transistor is below a preselected value.

8. The method of claim 6 wherein transitioning the output voltage during the first transitioning phase includes providing current flow between the output and an electrical element maintained at the second output voltage via a first device having a first current flow capacity, and transitioning the output voltage during the second transitioning phase includes limiting flow through the first device and providing current flow between the output and an electrical element maintained at the second output voltage only via a second device having a second current flow capacity less than the first device.

* * * * *